(12) United States Patent
Konomi

(10) Patent No.: US 9,941,409 B2
(45) Date of Patent: Apr. 10, 2018

(54) METHOD FOR MANUFACTURING A THIN FILM TRANSISTOR SUBSTRATE

(71) Applicant: Mitsubishi Electric Corporation, Tokyo (JP)

(72) Inventor: Takaharu Konomi, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/372,671

(22) Filed: Dec. 8, 2016

(65) Prior Publication Data

US 2017/0092775 A1 Mar. 30, 2017

Related U.S. Application Data

(62) Division of application No. 14/884,050, filed on Oct. 15, 2015, now Pat. No. 9,553,109.

(30) Foreign Application Priority Data

Nov. 12, 2014 (JP) ................. 2014-229474

(51) Int. Cl.
*H01L 29/786* (2006.01)
*H01L 29/66* (2006.01)
*H01L 27/12* (2006.01)
*G02F 1/1368* (2006.01)
*G02F 1/1362* (2006.01)

(52) U.S. Cl.
CPC ...... *H01L 29/78606* (2013.01); *G02F 1/1368* (2013.01); *G02F 1/136227* (2013.01); *H01L 27/124* (2013.01); *H01L 27/1225* (2013.01); *H01L 27/1262* (2013.01);
(Continued)

(58) Field of Classification Search
None
See application file for complete search history.

(56) References Cited

U.S. PATENT DOCUMENTS 6,449,026 B1 9/2002 Min et al.
2008/0111935 A1* 5/2008 Lee .................. G02F 1/133504
349/43

(Continued)

FOREIGN PATENT DOCUMENTS

JP S62-235784 A 10/1987
JP 2001-056474 A 2/2001
(Continued)

OTHER PUBLICATIONS

Nomura et al., "Room-temperature fabrication of transparent flexible thin-film transistors using amorphous oxide semiconductors," Nature, No. 432, (2004): pp. 488-492.

*Primary Examiner* — Bilkis Jahan
(74) *Attorney, Agent, or Firm* — Studebaker & Brackett PC

(57) ABSTRACT

A thin film transistor substrate includes a semiconductor channel layer made of an oxide semiconductor, protective insulating layers that cover the semiconductor channel layer, a first source electrode, a first drain electrode, a second source electrode, and a second drain electrode. The second source electrode is located on the first source electrode and connected with the semiconductor channel layer through a first contact hole. The second drain electrode is located on the first drain electrode and connected with the semiconductor channel layer through a second contact hole.

7 Claims, 14 Drawing Sheets

(52) U.S. Cl.
 CPC .... *H01L 29/66969* (2013.01); *H01L 29/7869* (2013.01); *G02F 2201/123* (2013.01)

(56) References Cited

U.S. PATENT DOCUMENTS

| | | | |
|---|---|---|---|
| 2008/0284935 A1* | 11/2008 | Takahashi | G02F 1/136286 349/46 |
| 2009/0189153 A1 | 7/2009 | Iwasaki et al. | |
| 2012/0056184 A1* | 3/2012 | Park | H01L 27/3272 257/59 |
| 2012/0138938 A1* | 6/2012 | Bae | G02F 1/13439 257/59 |
| 2013/0023086 A1 | 1/2013 | Chikama et al. | |
| 2013/0334524 A1* | 12/2013 | Miyake | H01L 27/1244 257/43 |
| 2014/0070211 A1 | 3/2014 | Iwasaki et al. | |
| 2016/0064421 A1* | 3/2016 | Oh | H01L 27/1222 257/43 |

FOREIGN PATENT DOCUMENTS

| | | |
|---|---|---|
| JP | 2005-077822 A | 3/2005 |
| JP | 2007-281409 A | 10/2007 |
| WO | 2011/077607 A1 | 6/2011 |

\* cited by examiner

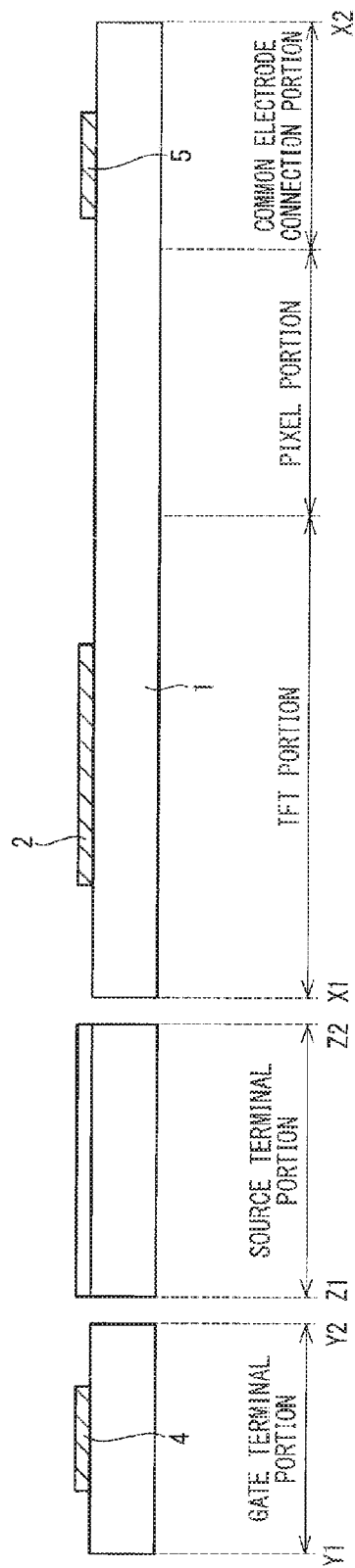
F I G. 4

F I G. 9
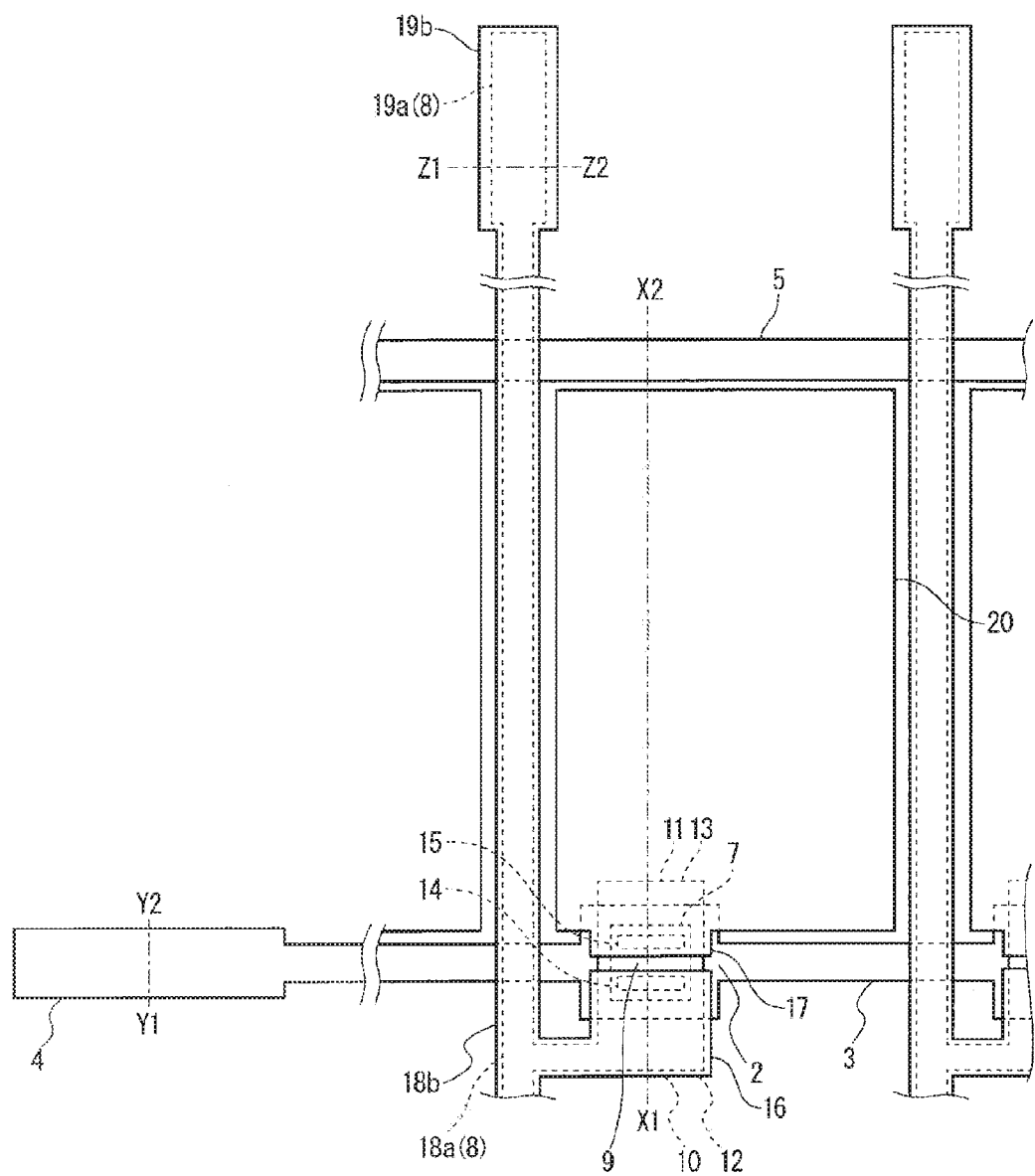

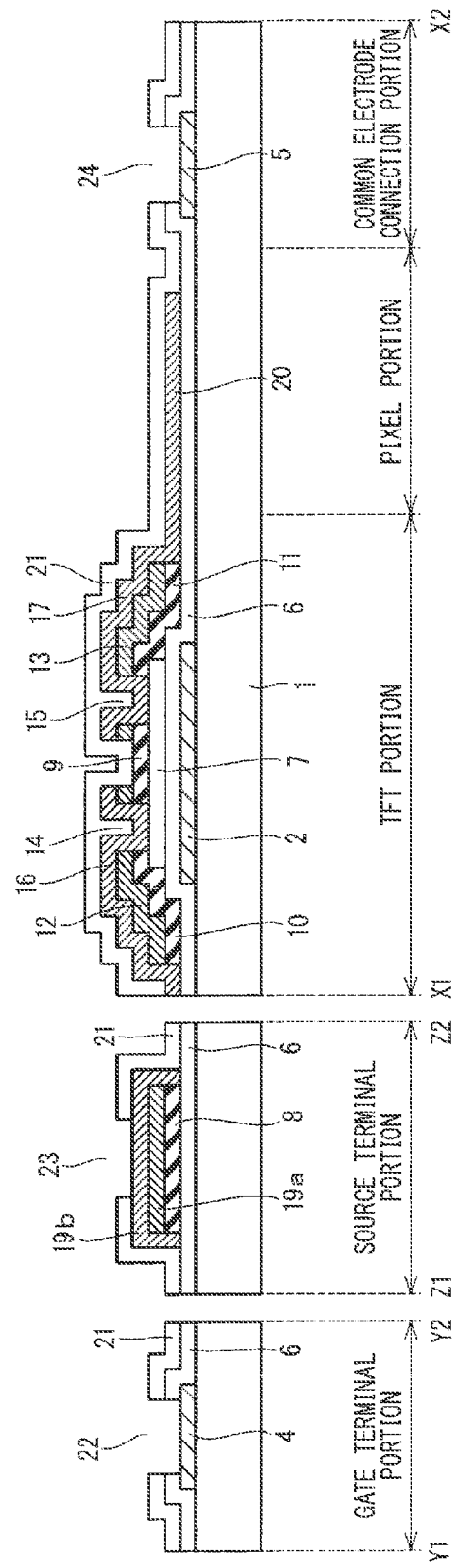
F I G. 1 2

METHOD FOR MANUFACTURING A THIN FILM TRANSISTOR SUBSTRATE

CROSS-REFERENCE TO RELATED APPLICATIONS

The present application is a Divisional Application of U.S. patent application Ser. No. 14/884,050 filed Oct. 15, 2015, which claims priority from Japanese Patent Application No. 2014-229474 filed Nov. 12, 2014, the contents of which are all herein incorporated by reference in their entirety.

BACKGROUND OF THE INVENTION

Field of the Invention

The present invention relates to a thin film transistor substrate, a method for manufacturing the same, and a liquid crystal display.

Description of the Background Art

Thin film transistor active matrix substrates (thin film transistor substrates (TFT substrates)) including thin film transistors (TFTs) as switching elements find use in electro-optical apparatuses such as displays (liquid crystal displays) including liquid crystals. The semiconductor devices such as the TFTs have features of being power-thrifty and thin, thus being used in place of cathode ray tubes (CRTs) and finding increasing applications to flat panel displays.

The electro-optical elements for use in liquid crystal displays (hereinafter also referred to as "LCDs") include passive matrix LCDs and TFT LCDs including TFTs as switching elements. In particular, the TFT LCDs are superior in portability and display quality to the CRTs and the passive matrix LCDs, thus finding widespread practical applications to display products such as notebook computers and TVs.

In general, the TFT LCD includes a liquid crystal display panel in which a liquid crystal layer is sandwiched between a TFT substrate and a counter substrate. The TFT substrate includes an array of a plurality of TFTs and the counter substrate includes, for example, a color filter. The liquid crystal display panel includes polarizing plates located on the front surface side and the back surface side and a backlight located on one of these sides. This structure provides an excellent color display.

The LCDs employing the in-plane switching (IPS) (registered trademark) mode have the advantage in wide viewing angle and thus are widely used in, for example, displays. The IPS mode is the transverse electric field liquid crystal driving mode yielding an improvement in the viewing angle of the conventional TFT LCDs. Unfortunately, such LCDs have a low aperture ratio and a low transmittance in the pixel display portion, and thus, can hardly have bright display properties. It is considered that the following factor plays a major role in interfering with the bright display properties. The electric field for driving liquid crystals fails to work properly above the comb-teeth shaped pixel electrode included in the IPS LCD, so that a part of the liquid crystals located above the pixel electrode is not driven. To solve this problem, the LCD disclosed in, for example, Japanese Patent Application Laid-Open No. 2001-56474 has been proposed which employs the fringe field switching (FFS) mode.

For the switching element of the TFT substrate included in the conventional liquid crystal display, amorphous silicon (Si) has been used as the semiconductor film being the active layer (channel layer). In recent years, the TFTs including an active layer made of an oxide semiconductor have been actively developed. Such oxide semiconductor has a higher mobility than that of the conventionally-used amorphous silicon. The oxide semiconductor is mainly the material based on zinc oxide (ZnO) or the material based on amorphous InGaZnO obtained by adding gallium oxide ($Ga_2O_3$) and indium oxide ($In_2O_3$) to zinc oxide. This technique is disclosed in, for example, Japanese Patent Application Laid-Open No. 2001-56474, Japanese Patent Application Laid-Open No. 2005-77822, and Kenji Nomura, et al., "Room-temperature fabrication of transparent flexible thin-film transistors using amorphous oxide semiconductors," Nature, no. 432 (2004): 488-492.

Similarly to the oxide conductors being the transparent conductors such as amorphous ITO (indium oxide ($In_2O_3$)+ tin oxide ($SnO_2$)) and amorphous InZnO (indium oxide ($In_2O_3$)+zinc oxide (ZnO)), the above-mentioned oxide semiconductor can be etched with a weak acid solution containing oxalic acid or carboxylic acid, thus having the advantage of being easily patterned.

However, in some cases, the oxide semiconductor is damaged by the acid solution used to etch a general metal film which is to be formed into a source electrode and a drain electrode of the TFT, resulting in characteristics degradation. The oxide semiconductors made of certain kinds of material may dissolve in the above-mentioned acid solution. Thus, as described in Japanese Patent Application Laid-Open No. 2007-281409, for the manufacturing of the TFT (generally referred to as back channel etch (BCE) TFT) including the source electrode and the drain electrode as an upper layer on the oxide semiconductor film, the oxide semiconductor film being the channel layer is damaged by the acid solution in some cases during the processing of the source electrode and the drain electrode, resulting in the degradation of the TFT characteristics. In other cases, the oxide semiconductor film being the channel layer is damaged due to the oxidation-reduction reaction in the interface during the deposition of the metal film which is to be formed into the source electrode and the drain electrode, causing the degradation of the TFT characteristics.

These problems can be solved by applying the TFT structure that includes, as an upper layer on the semiconductor layer, a protective layer to protect the semiconductor layer as described in Japanese Patent Application Laid-Open No. 62-235784 (1987) and International Publication No. WO 2011/077607. Such TFT structure can prevent or reduce damage to the oxide semiconductor film during the etching of the metal film which is to be formed into the source electrode and the drain electrode or loss of the oxide semicondcutor resulting from the etching. This structure is generally referred to as "etching stopper (ES) TFT" or "etch stopper (ES) TFT" as a reflection of the above-mentioned function.

The application of the etch stopper TFT structure to the TFTs of the general FFS LCD disclosed in, for example, Japanese Patent Application Laid-Open No. 2001-56474 requires an additional photolithography process dedicated to the formation of the protective layer on the oxide semiconductor layer. Unfortunately, the additional photolithography process required in the manufacturing process reduces the production capacity and increases the manufacturing cost. The increased manufacturing cost resulting from the application of the etch stopper TFT structure is the problem associated not only with the FFS LCDs but also with other LCDs in which the TFTs including the active layer being the oxide semiconductor serve as switching elements.

If the general metal film which is to be formed into the source electrode and the drain electrode is deposited directly onto the oxide semiconductor film by sputtering or chemical vapor deposition in the state where the channel layer (region) of the semiconductor film is protected by the etch stopper layer, the interface reaction (the oxidation-reduction reaction) would occur in the source region and the drain region of the semiconductor film that are electrically connected with the source electrode and the drain electrode. If this is the case, the oxidation-reduction reaction in the oxide semiconductor film would have a spread effect across the semiconductor layer including the channel region, resulting in the degradation of the TFT characteristics.

SUMMARY OF THE INVENTION

The present invention therefore has been made in view of the above-mentioned problems, and an object thereof is to provide a technique capable of improving the characteristics of a thin film transistor.

The present invention is a thin film transistor substrate including an insulating substrate, a gate electrode, a first insulating film, a semiconductor film formed of an oxide semiconductor, a first source electrode formed of a conductor other than oxide conductors, a first drain electrode formed of a conductor other than oxide conductors, a second source electrode formed of an oxide conductor, a second drain electrode formed of an oxide conductor, a pixel electrode, and a third insulating film. The gate electrode is located on the insulating substrate. The first insulating film covers the gate electrode. The semiconductor film is located over the gate electrode with the first insulating film located therebetween. The second insulating film covers the semiconductor film. The first source electrode is located on one end of the second insulating film. The first drain electrode is located on another end of the second insulating film. The second source electrode is located on the first source electrode and connected with the semiconductor film through a first contact hole provided in the first source electrode and the second insulating film. The second drain electrode is located on the first drain electrode and connected with the semiconductor film through a second contact hole provided in the first drain electrode and the second insulating film. The pixel electrode is formed by extending a part of the second drain electrode. The third insulating film covers the first insulating film, the second source electrode, the second drain electrode, and the pixel electrode.

The present invention is capable of improving the characteristics of the thin film transistor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view of the configuration of the TFT substrate according to the preferred embodiment after the first photolithography process;

FIG. 9 is a plan view of the configuration of the TFT substrate according to the preferred embodiment after a fourth photolithography process;

FIG. 12 is a cross-sectional view of the configuration of the TFT substrate according to the preferred embodiment after the fifth photolithography process;

DESCRIPTION OF THE PREFERRED EMBODIMENTS

Preferred Embodiment

Figure 1:
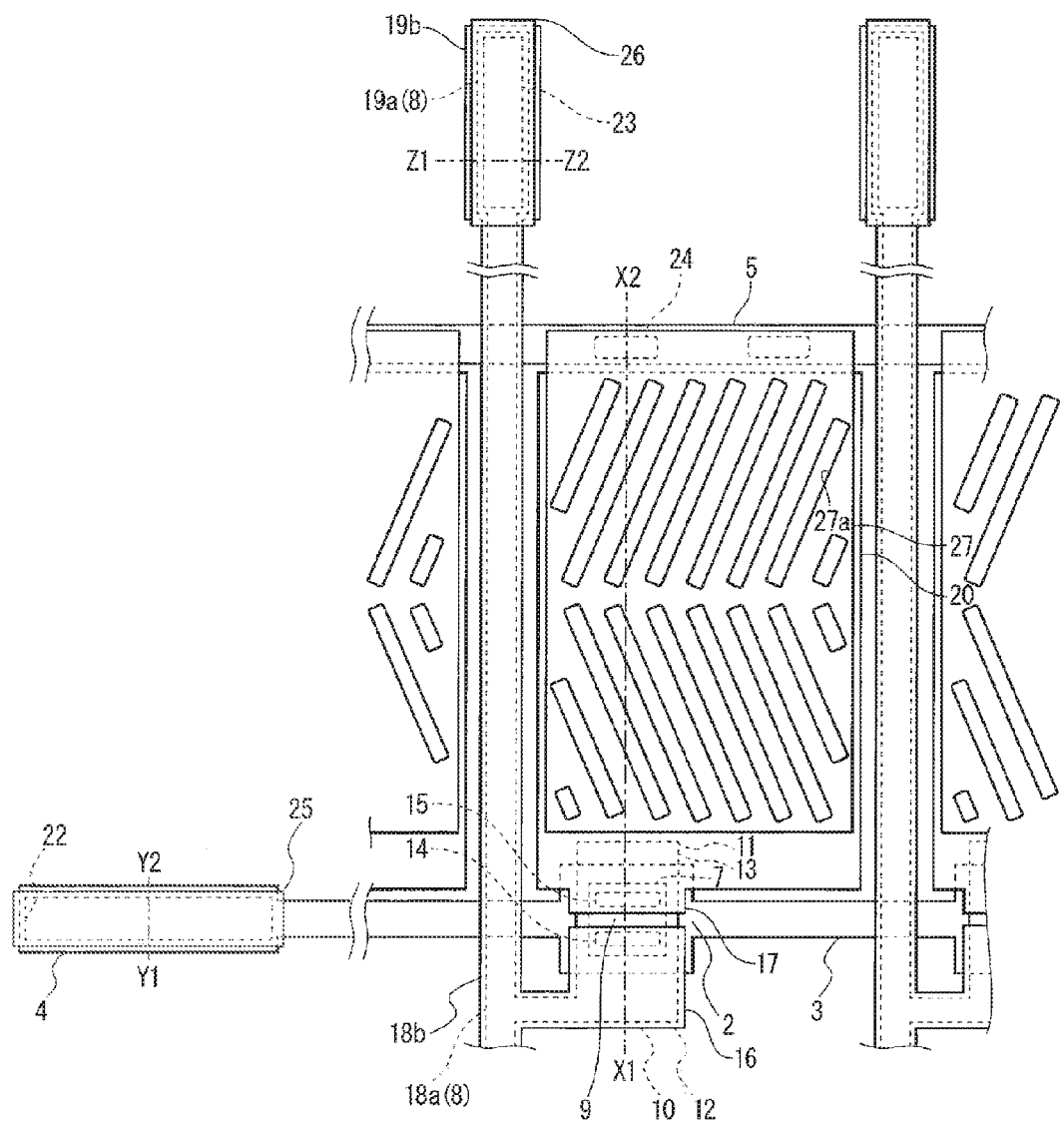
FIG. 1 is a plan view of the configuration of a TFT substrate according to a preferred embodiment.
Figure 2:
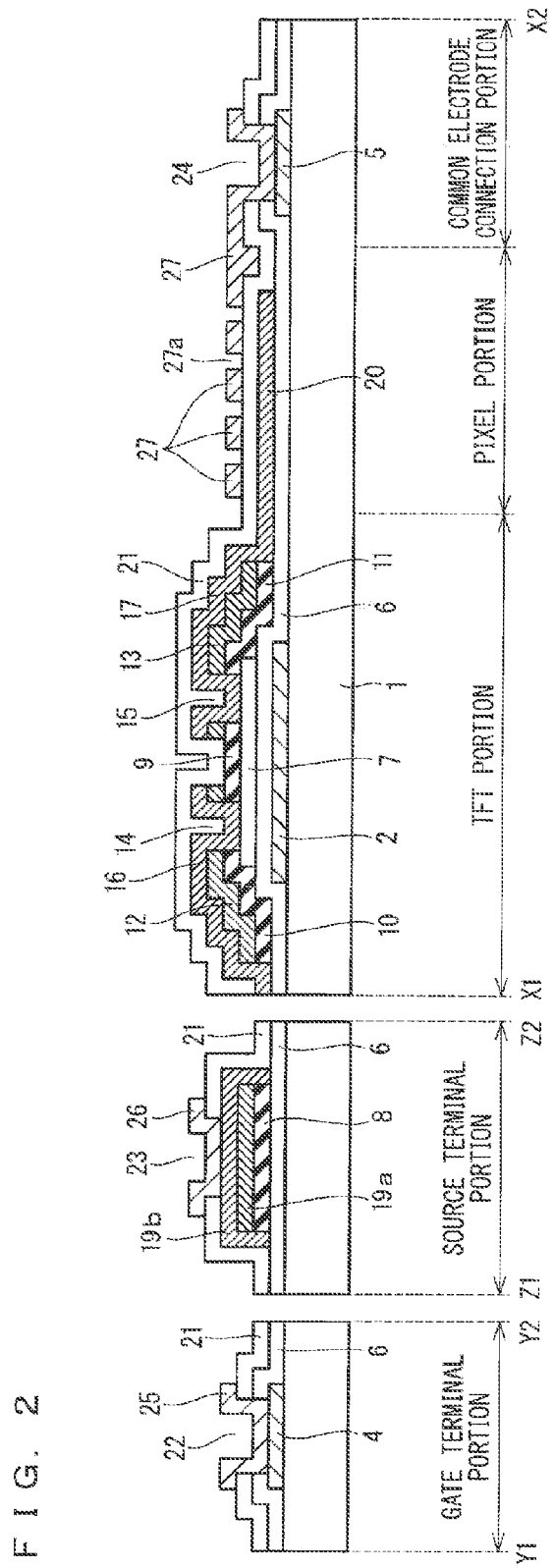
FIG. 2 is a cross-sectional view of the configuration of the TFT substrate according to the preferred embodiment.

With reference to FIGS. 1 and 2, the following describes the configuration of a TFT substrate according to this preferred embodiment. FIG. 1 is a view of the planar configuration of a pixel portion as well as a gate terminal portion and a source terminal portion outside the pixel portion (pixel display region) of the TFT substrate in the FFS mode. FIG. 2 is a view of the cross-sectional configuration of these portions. FIG. 2 shows cross sections taken along the line X1-X2, the line Y1-Y2, and the line Z1-Z2 in FIG. 1. The cross section taken along the line X1-X2 corresponds to the region (the pixel portion) in which pixels are located. The cross section taken along the line Y1-Y2 corresponds to the region (the gate terminal portion) in which a gate terminal 4 and a gate terminal pad 25 for supplying a gate signal to a gate wire 3 (not shown in FIG. 2) are located. The cross section take along the line Z1-Z2 corresponds to the region (the source terminal portion) in which source terminals 19a and 19b and a source terminal pad 26 for applying a display signal to source wires 18a and 18b (not shown in FIG. 2) are located.

As shown in FIG. 2, the pixel portion includes, along the X1-X2 line, a TFT portion being the region in which the TFT is located, a transmissive pixel portion being the region in which a pixel electrode 20 and a counter electrode 27 are located, and a common electrode connection portion in which the counter electrode 27 and a common wire 5 are connected.

The TFT substrate according to this preferred embodiment includes an insulating substrate 1, a gate electrode 2, the common wire 5, a first insulating film 6, a semiconductor channel layer 7 being a semiconductor film, protective insulating layers 9, 10, and 11 being a second insulating film, a first source electrode 12, a first drain electrode 13, a second source electrode 16, a second drain electrode 17, the pixel electrode 20, a third insulating film 21, and the counter electrode 27. The following describes these constituent components and the remaining constituent components (such as the gate wire 3) of the TFT substrates according to this preferred embodiment.

The insulating substrate 1 is the transparent insulating substrate made of, for example, glass. The gate electrode 2, the gate wire 3, the gate terminal 4, and the common wire 5 are located on the insulating substrate 1. The first insulating film 6 covers the gate electrode 2, the gate wire 3, the gate terminal 4, and the common wire 5. The first insulating film 6 functions as the gate insulating film in the TFT portion, and thus, is hereinafter also referred to as "gate insulating film 6."

As shown in FIG. 1, the gate wire 3 extends in the lateral direction and is electrically connected with the gate electrode 2 and the gate terminal 4. The segment of the gate wire 3 located in the TFT portion (a part of the gate wire 3) is the gate electrode 2. The gate electrode 2 has a width greater than that of the remaining part of the gate wire 3. The segment of the gate wire 3 located in the gate terminal portion (the end portion of the gate wire 3) is the gate terminal 4. The common wire 5 extends in parallel with the gate wire 3. The first insulating film 6 and the third insulating film 21 may be omitted as appropriate in FIG. 1 and the subsequent plan views.

As shown in FIGS. 1 and 2, the TFT portion of the TFT substrate according to this preferred embodiment includes the gate electrode 2, the gate insulating film 6 (the first insulating film 6), the semiconductor channel layer 7, the protective insulating layer 9, the first source electrode 12, the first drain electrode 13, the second source electrode 16, and the second drain electrode 17. The electrode 2 and the gate insulating film 6 are as described above.

The semiconductor channel layer 7 being the semiconductor film is located over the gate electrode 2 with the gate insulating film 6 located therebetween. In this preferred embodiment, the semiconductor channel layer 7 is located inside the periphery of the gate electrode 2 in plan view.

The semiconductor channel layer 7 is made of an oxide semiconductor. The oxide semiconductor provided as the semiconductor channel layer 7 may be, for example, the oxide semiconductor based on zinc oxide (ZnO), the oxide semiconductor based on InZnSnO obtained by adding indium oxide ($In_2O_3$) and tin oxide ($SnO_2$) to zinc oxide, or the oxide semiconductor based on InGaZnO obtained by adding gallium oxide ($Ga_2O_3$) and indium oxide ($In_2O_3$) to zinc oxide. The semiconductor channel layer 7 made of the oxide semiconductor offers an improved mobility over the semiconductor channel layer 7 made of amorphous silicon.

The protective insulating layers 9, 10, and 11 being the second insulating film cover the semiconductor channel layer 7. The protective insulating layer 10 is located on the upper part and the side part of one end of the semiconductor channel layer 7. The protective insulating layer 11 is located on the upper part and the side part of another end of the semiconductor channel layer 7. The protective insulating layer 9 is located on the semiconductor channel layer 7 between the protective insulating layer 10 and the protective insulating layer 11. The following description is given assuming that the protective insulating layer 9 is continuous with the protective insulating layers 10 and 11. Alternatively, the protective insulating layer 9 may be separated from the protective insulating layers 10 and 11.

The first source electrode 12 is located on the protective insulating layer 10 and the end portion of the protective insulating layer 9 on the protective insulating layer 10 side, or equivalently, on one end of the second insulating film. The first drain electrode 13 is located on the protective insulating layer 11 and another end portion of the protective insulating layer 9 on the protecting insulating layer 11 side, or equivalently, on another end of the second insulating film.

The first source electrode 12 and the first drain electrode 13 are made of a conductor other than oxide conductors and are separated from each other. In this preferred embodiment, the first source electrode 12 and the first drain electrode 13 are made of a conductor being a metal or an alloy (for example, the alloy obtained by adding trace amounts of another element to each of molybdenum (Mo) and aluminum (Al)).

The second source electrode 16 is located on the first source electrode 12 and connected with the semiconductor channel layer 7 through a first contact hole 14 provided in the first source electrode 12 and the protective insulating layers 9, 10, and 11. The second source electrode 16 is made of an oxide conductor (such as an ITO film containing $In_2O_3$ and $SnO_2$). In this preferred embodiment, the first contact hole 14 is provided between the protective insulating layer 9 and the protective insulating layer 10.

Similarly, the second drain electrode 17 is located on the first drain electrode 13 and connected with the semiconductor channel layer 7 through a second contact hole 15 provided in the first drain electrode 13 and the protective insulating layers 9, 10, and 11. The second drain electrode 17 is made of an oxide conductor (such as an ITO film containing $In_2O_3$ and $SnO_2$). In this preferred embodiment, the second contact hole 15 is provided between the protective insulating layer 9 and the protective insulating layer 11.

The following describes the constituent components of the TFT substrate other than the TFT portion.

As shown in FIG. 1, the first source electrode 12 is located so as to branch off from the source wire 18a. Similarly, the second source electrode 16 on the first source electrode 12 is located so as to branch off from the source wire 18b on the source wire 18a and the protective insulating layer 10 below the first source electrode 12 is located so as to branch off from a protective insulating layer 8 below the source wire 18a. The end portions of the source wires 18a and 18b are provided with the source terminals 19a and 19b, respectively.

As shown in FIG. 2, the pixel electrode 20 is connected with the second drain electrode 17 and located on the first insulating film 6. In this preferred embodiment, the pixel electrode 20 is formed by laterally extending a part of the second drain electrode 17.

The third insulating film 21 covers the first insulating film 6 on the common wire 5, the second source electrode 16, the second drain electrode 17, and the pixel electrode 20. In this preferred embodiment, the third insulating film 21 also covers, for example, the first insulating film 6 on the gate terminal 4 and the protective insulating layer 9.

The gate terminal pad 25 is electrically connected with the gate terminal 4 through a gate contact hole 22 provided in the first insulating film 6 and the third insulating film 21. The source terminal pad 26 is electrically connected with the source terminals 19a and 19b through a source contact hole 23 provided in the third insulating film 21.

The counter electrode 27 is located over the pixel electrode 20 with the third insulating film 21 located therebetween. The counter electrode 27 is connected with the common electrode 5 through a common electrode contact hole 24 (a third contact hole) provided in the first insulating film 6 and the third insulating film 21. The counter electrode 27 has a slit opening 27a. Thus, when a voltage is applied between the pixel electrode 20 and the counter electrode 27, the counter electrode 27 can generate a transverse electric field between the pixel electrode 20 and the counter electrode 27 above the counter electrode 27.

<Manufacturing Method>

With reference to FIGS. 3 to 14, the following describes a method for manufacturing the TFT substrate according to this preferred embodiment. In FIGS. 3 to 14, the constituent components corresponding to the constituent components shown in FIGS. 1 and 2 are denoted by the same reference signs in FIGS. 1 and 2.

Firstly, the insulating substrate 1 is cleaned with cleaning fluid or pure water. In this preferred embodiment, the glass substrate having a thickness of 0.5 mm was used as the insulating substrate 1. Then, a first conductive film being the material of, for example, the gate electrode 2 and the gate wire 3 is deposited on the entirety of one main surface of the cleaned insulating substrate 1.

The first conductive film may be, for example, a general metal, such as chromium (Cr), molybdenum (Mo), titanium (Ti), copper (Cu), tantalum (Ta), tungsten (W) or aluminum (Al), or an alloy obtained by adding at least one different element to the above-mentioned metallic element being the base component. The base component element is the element of the highest content among the elements contained in the alloy. The first conductive film may have a laminated structure including at least two layers of such metal or alloy. A low-resistant conductive film having a specific resistance value of 50 $\mu\Omega$ cm or less can be made of such metal or alloy. In this preferred embodiment, an aluminum (Al) alloy film having a thickness of 200 nm was deposited as the first conductive film by sputtering, using argon (Ar) gas.

Then, a resist material is applied onto the Al alloy film. In a first photolithography process, the resist material is formed into a photoresist pattern and the Al alloy film is selectively etched to be patterned, using the photoresists pattern as a mask. The Al alloy film may be wet-etched with a solution (PAN chemical solution) containing, for example, phosphoric acid, acetic acid, and nitric acid. Then, the photoresist pattern is removed.

Figure 3:
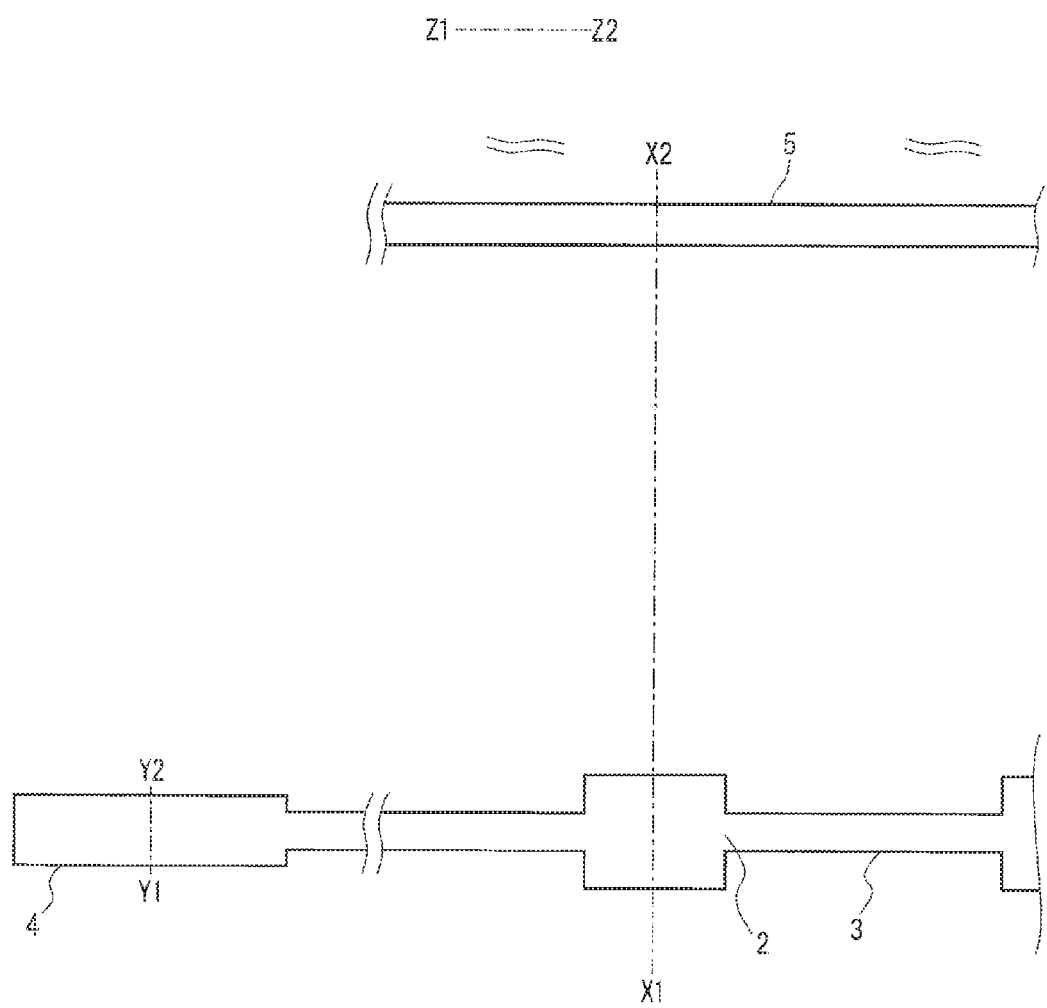
FIG. 3 is a plan view of the configuration of the TFT substrate according to the preferred embodiment after a first photolithography process.

Consequently, as shown in FIGS. 3 and 4, the gate electrode 2, the gate wire 3, the gate terminal 4, and the common wire 5 on the insulating substrate 1 are formed by patterning the first conductive film.

Next, a first to-be-processed insulating film being the material of the first insulating film 6 is deposited on the entire upper surface of the insulating substrate 1. In this preferred embodiment, a silicon oxide (SiO) film and a silicon nitride (SiN) film were formed as the first to-be-processed insulating film by chemical vapor deposition (CVD). The silicon oxide film having a thickness of 50 nm and the silicon nitride film having a thickness of 400 nm were deposited. The silicon oxide film has poor barrier properties (shielding properties) against impurity elements affecting the TFT characteristics, such as water ($H_2O$), hydrogen ($H_2$), sodium (Na), and potassium (K). Thus, the first to-be-processed film was formed into a laminated structure including, for example, SiN having excellent barrier properties as the lower layer below SiO. The majority of the first to-be-processed film is to be formed into the first insulating film 6 and the gate insulating film 6, and therefore, the first to-be-processed film is referred to as the gate insulating film 6 or the first insulating film 6 in the following description.

Then, an oxide semiconductor film being the material of the semiconductor channel layer 7 is deposited on the first insulating film 6. In this preferred embodiment, the oxide semiconductor of the film is the oxide (such as InGaZnO) containing In, Ga, and Zn. As an example, an InGaZnO oxide semiconductor film was deposited by sputtering, using an In—Ga—Zn—O target [$In_2O_3.Ga_2O_3.(ZnO)_2$] in which the atomic composition ratio of In:Ga:Zn:O is 1:1:1:4. The oxide semiconductor film deposited as described above usually has an atomic composition ratio of oxygen that is smaller than the stoichiometry. Consequently, the oxide semiconductor film becomes deficient in oxygen ion (the composition ratio of O is less than 4 in the above example). Thus, Ar gas mixed with oxygen ($O_2$) gas is preferably used for sputtering. In this preferred embodiment, a sputtering was performed using Ar gas containing $O_2$ gas mixed at 10% by partial pressure ratio, whereby an InGaZnO film having a thickness of 50 nm was deposited. The InGaZnO film formed as described above has an amorphous structure. The InGaZnO film having the amorphous structure usually has a crystallization temperature of 500° C. or higher. Thus, at room temperature, the majority of the InGaZnO film has the amorphous structure with stability.

Next, in a second photolithography process, a photoresist pattern is formed and the oxide semiconductor film is selectively etched to be patterned, using the photoresist pattern as a mask. The oxide semiconductor film may be wet-etched with a chemical solution containing, for example, carboxylic acid. The chemical solution containing carboxylic acid preferably has an oxalic acid content of, for example, 1 to 10 wt %. In this preferred embodiment, the oxide semiconductor film was etched with an oxalic-acid-based chemical solution containing 5 wt % oxalic acid and water. Then, the photoresist pattern is removed.

Figure 5:
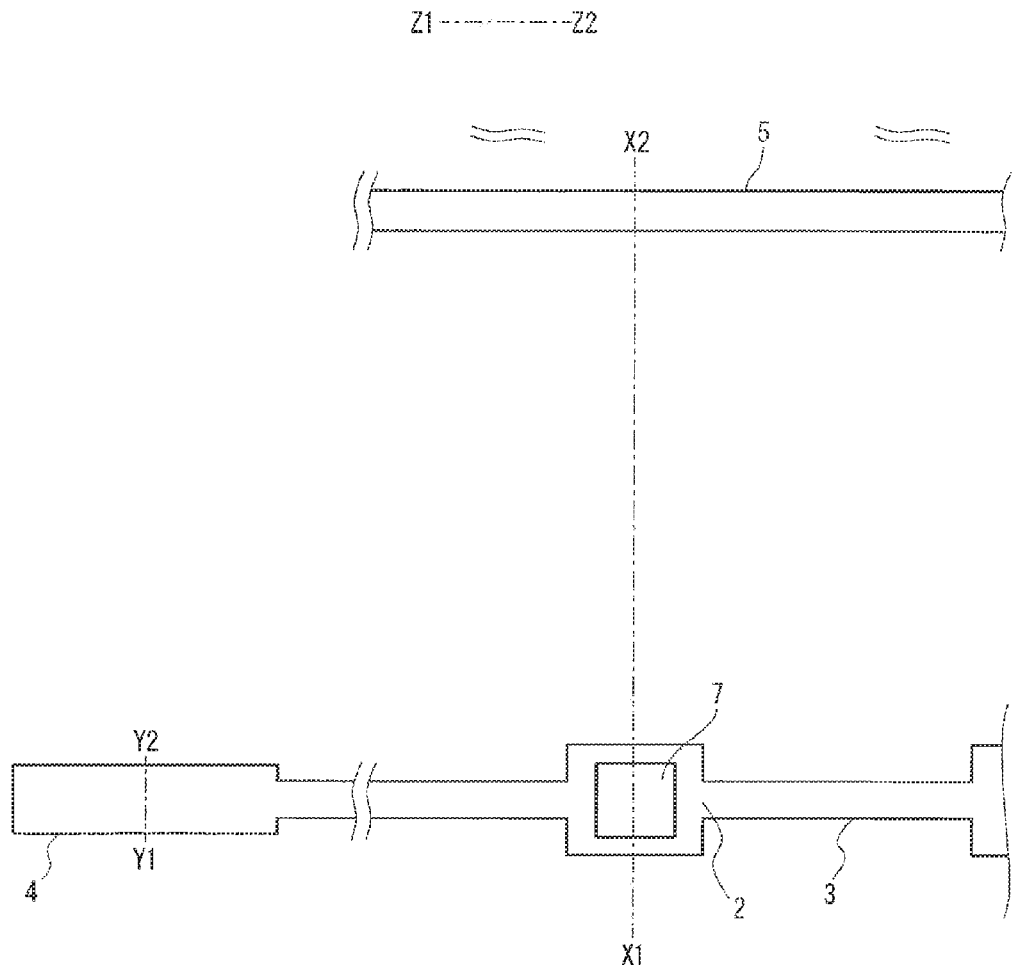
FIG. 5 is a plan view of the configuration of the TFT substrate according to the preferred embodiment after a second photolithography process.
Figure 6:
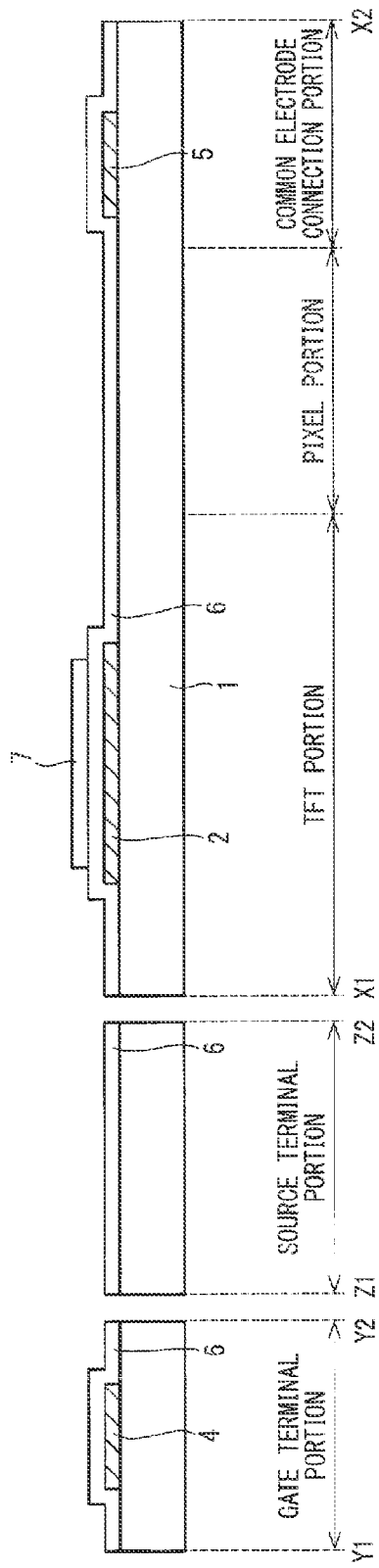
FIG. 6 is a cross-sectional view of the configuration of the TFT substrate according to the preferred embodiment after the second photolithography process.

Consequently, as shown in FIGS. 5 and 6, the semiconductor channel layer 7 located over the gate electrode 2 with the first insulating film 6 located therebetween is formed by patterning the oxide semiconductor film. The portion of the first insulating film 6 sandwiched between the gate electrode 2 and the semiconductor channel layer 7 functions as the gate insulating film 6.

Next, a second to-be-processed insulating film being the material of the protective insulating layers 8, 9, 10, and 11 is deposited on the first insulating film 6 and the semiconductor channel layer 7. In this preferred embodiment, a SiO film having a thickness of, for example, 100 nm was formed as the second to-be-processed film by CVD.

Subsequently, a second conductive film is deposited on the second to-be-processed insulating film. In this preferred embodiment, as the second conductive film, a laminated structure was formed by laminating the alloy obtained by adding trace amounts of another element to each of molybdenum (Mo) and aluminum (Al).

Next, in a third photolithography process, a photoresist pattern is formed, and the second conductive film (the film including a lamination of Al alloy and Mo alloy) is selectively etched to be patterned, using the photoresist pattern as a mask. The second conductive film may be wet-etched with a solution (PAN chemical solution) containing, for example, phosphoric acid, acetic acid, and nitric acid. In this preferred embodiment, the second conductive film is etched with the PAN chemical solution containing 70 wt % phosphoric acid, 7 wt % acetic acid, 5 wt % nitric acid, and water. In this stage, the semiconductor channel layer 7 being the lower layer is protected by the second to-be-processed insulating film, and thus, is not damaged by the chemical solution.

Then, the second to-be-processed insulating film is selectively etched to be patterned, using the yet-to-be removed photoresist pattern and the patterned second conductive film as a mask. The second to-be-processed insulating film may be dry-etched with a gas containing, for example, fluorine. In this preferred embodiment, the second to-be-processed insulating film was dry-etched with a gas obtained by adding oxygen ($O_2$) to sulfur hexafluoride ($SF_6$). The addition of $O_2$ can prevent or reduce the damage to the semiconductor channel layer 7 being the lower layer caused by oxidation-reduction reaction during etching. Then, the photoresist pattern is removed.

Figure 7:
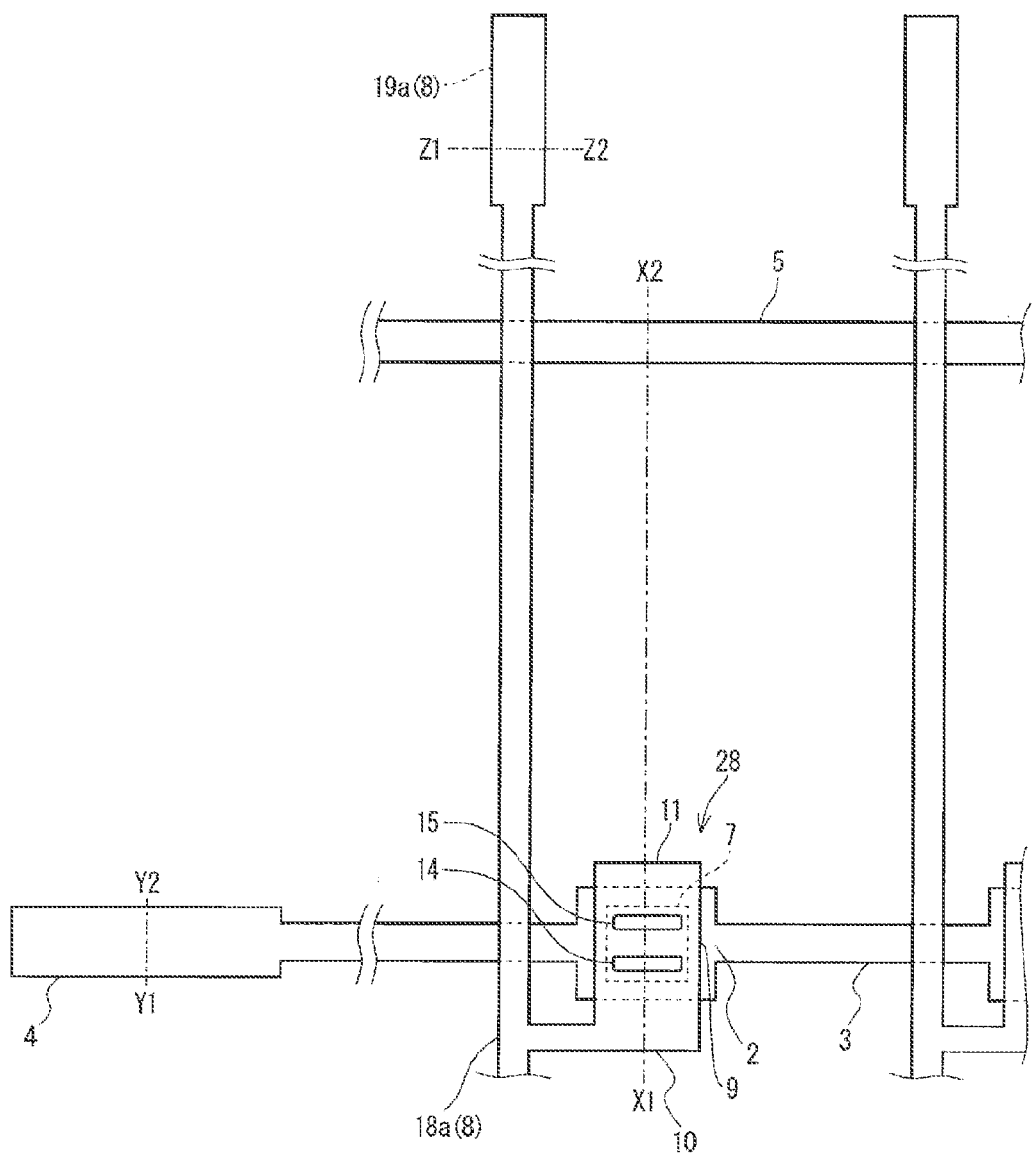
FIG. 7 is a plan view of the configuration of the TFT substrate according to the preferred embodiment after a third photolithography process.
Figure 8:
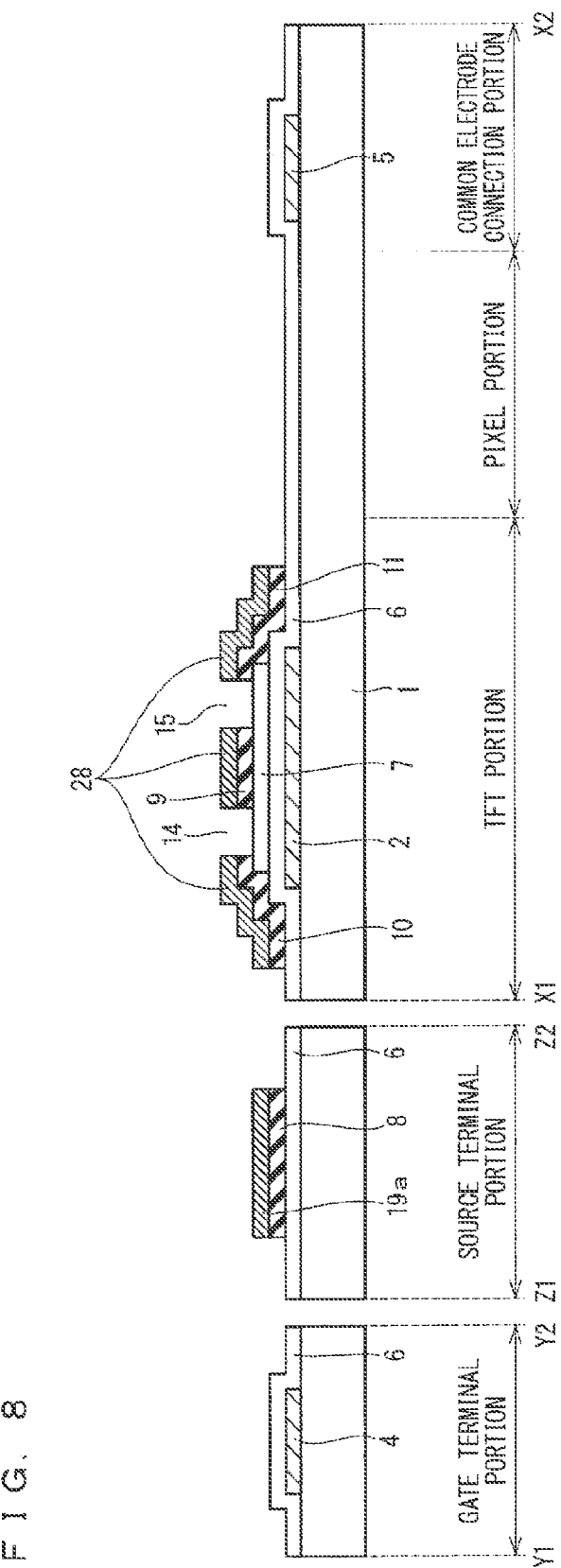
FIG. 8 is a cross-sectional view of the configuration of the TFT substrate according to the preferred embodiment after the third photolithography process.

Consequently, as shown in FIGS. 7 and 8, in one photolithography process (in the third photolithography process of this example), the protective insulating layers 9, 10, and 11 on the semiconductor channel layer 7 and the protective insulating layer 8 are formed by patterning second to-be-processed insulating film and an electrode body 28, the source wire 18a, and the source terminal 19a are formed by patterning the second conductive film. Through the above-mentioned patterning of the second to-be-processed insulating film, the first contact hole 14 is formed over the source region of the semiconductor channel layer 7 and the second contact hole 15 is formed over the drain region of the semiconductor channel layer 7.

The electrode body 28 mentioned above is the structure including the first source electrode 12 located on the protective insulating layer 10 and the end portion of the protective insulating layer 9 on the protective insulating layer 10 side and including the first drain electrode 13 located on the protective insulating layer 11 and the end portion of the protective insulating layer 9 on the protective insulating layer 11 side. The first source electrode 12 and the first drain electrode 13 are continuous with each other on the protective insulating layer 9. As shown in FIG. 8, the portions of the electrode body 28 corresponding to the first source electrode 12 and the first drain electrode 13 are not located directly on the semiconductor channel layer 7 and are located over the semiconductor channel layer 7 with the protective insulating layers 9, 10, and 11 located therebetween.

Then, a third conductive film being the material of the second source electrode 16 and the second drain electrode 17 is deposited. The second source electrode 16 and the second drain electrode 17 electrically connect the semiconductor channel layer 7, the first source electrode 12, and the first drain electrode 13. In this preferred embodiment, the third conductive film is an ITO film being a light-transmissive oxide-based conductive film (in which the mixing ratio (weight percentage) of $In_2O_3$ and $SnO_2$ is 90:10). In general, ITO films have the crystalline (polycrystalline) structure with stability at room temperature. In this example, an ITO film having a thickness of 100 nm and being in the amorphous state is deposited by sputtering, using a mixture gas of argon (Ar) gas and a gas containing hydrogen (H) such as hydrogen ($H_2$) gas or water vapor ($H_2O$).

Next, in a fourth photolithography process, a photoresist pattern is formed and the third conductive film (the amorphous ITO film) is selectively etched to be patterned, using the photoresist pattern as a mask. The third conductive film may be wet-etched with an oxalic-acid-based chemical solution containing, for example, 5 wt % oxalic acid and water.

Then, the electrode body 28 is selectively etched, using the yet-to-be removed photoresist pattern and the patterned third conductive film as a mask. Consequently, the portion of the electrode body 28 located on the protective insulating layer 9 and continuous with the first source electrode 12 and the first drain electrode 13 is removed. Thus, the source electrodes (the first and second source electrodes 12 and 16) are electrically isolated from the drain electrodes (the first and second drain electrodes 13 and 17). The electrode body 28 may be wet-etched with, for example, a PAN chemical solution. Then the photoresist pattern is removed.

Figure 10:
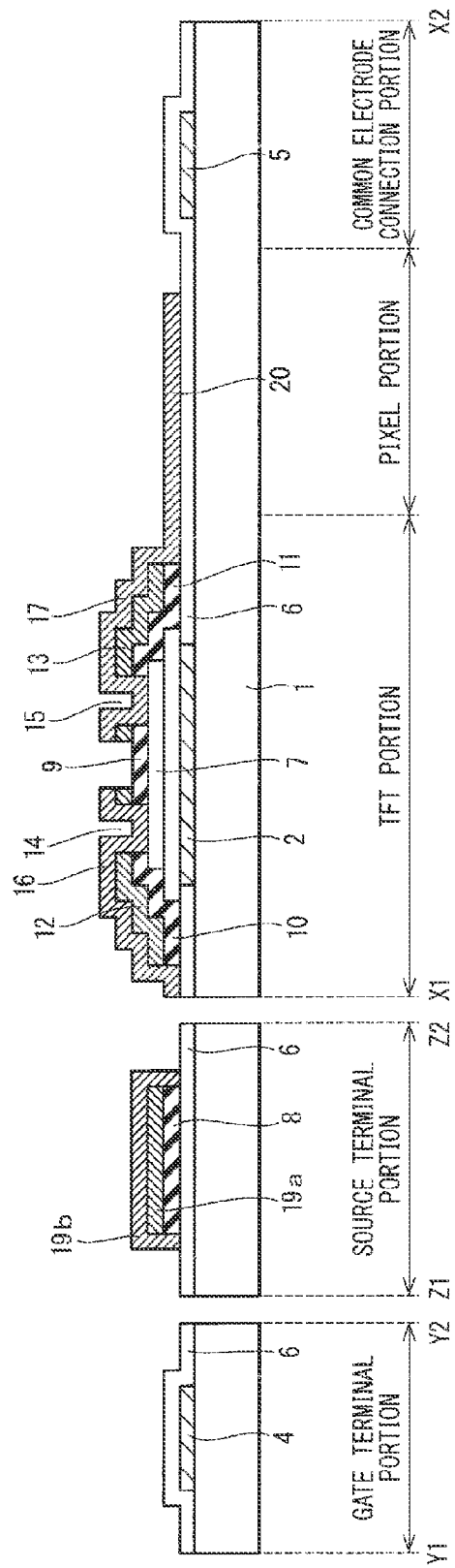
FIG. 10 is a cross-sectional view of the configuration of the TFT substrate according to the preferred embodiment after the fourth photolithography process.

Consequently, as shown in FIGS. 9 and 10, in another photolithography process (in the fourth photolithography process of this example), the second source electrode 16, the second drain electrode 17, the pixel electrode 20 being the portion of the second drain electrode 17 corresponding to the pixel display region, the source wire 18b, and the source terminal 19b are formed by patterning the third conductive film and the first source electrode 12 and the first drain electrode 13 are formed by patterning the electrode body 28.

The second source electrode 16 and the second drain electrode 17 that are made of an oxide conductor such as ITO are directly connected with the semiconductor channel layer 7 being the lower layer through the respective contact holes being the first contact hole 14 and the second contact hole 15. The oxidation-reduction reaction in the source region and the drain region of the semiconductor channel layer 7 is prevented or further reduced in this configuration than in the configuration in which the first source electrode 12 and the first drain electrode 13 made of a conductor other than oxide conductors are directly connected with the semiconductor channel layer 7. This can prevent or reduce the degradation of the characteristics of the semiconductor channel layer 7.

As described above, the second source electrode 16, the second drain electrode 17, and the pixel electrode 20 are formed, and then, a third to-be-processed film being the material of the third insulating film 21 is deposited on the entire upper surface of the insulating substrate 1. In this preferred embodiment, a silicon oxide (SiO) film having a thickness of 200 nm and a silicon nitride (SiN) film having a thickness of 100 nm were deposited as the third to-be-processed film by CVD in the stated order.

Then, in a fifth photolithography process, a photoresist pattern is formed and the third to-be-processed insulating film and the first insulating film 6 are selectively etched to be patterned, using the photoresist pattern as a mask. The third to-be-processed insulating film and the first insulating film 6 may be dry-etched with a gas containing, for example, fluorine. In this preferred embodiment, the third to-be-processed insulating film and the first insulating film 6 were dry-etched with a gas obtained by adding oxygen ($O_2$) to sulfur hexafluoride ($SF_6$). Then, the photoresist pattern is removed.

Figure 11:
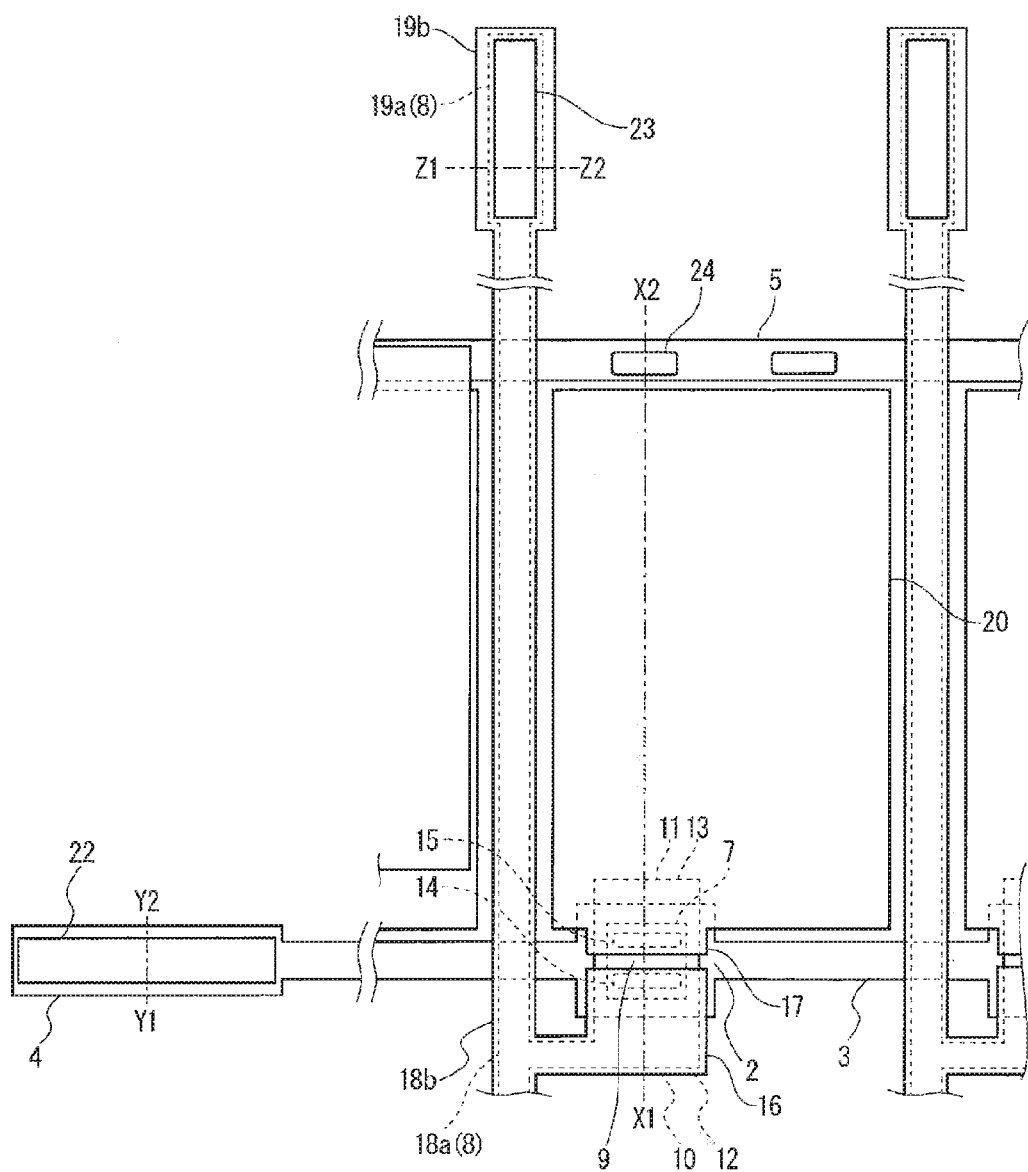
FIG. 11 is a plan view of the configuration of the TFT substrate according to the preferred embodiment after a fifth photolithography process.

Consequently, as shown in FIGS. 11 and 12, the third insulating film 21 having the gate contact hole 22 in the gate terminal portion, the source contact hole 23 in the source terminal portion, and the common electrode contract hole 24 in the common electrode connection portion are formed by patterning the third to-be-processed insulating film.

Then, a fourth conductive film is deposited. The fourth conductive film is the material of the gate terminal pad 25 electrically connected with the gate terminal 4 through the gate contact hole 22, the source terminal pad 26 electrically connected with the source terminals 19a and 19b through the source contact hole 23, and the counter electrode 27 electrically connected with the common wire 5 through the common electrode contact hole 24. In this preferred embodiment, a light-transmissive conductive film is deposited as the fourth conductive film. The light-transmissive conductive film is an ITO film (in which the mixing ratio (weight percentage) of $In_2O_3$ and $SnO_2$ is 90:10). In general, ITO films have the crystalline (polycrystalline) structure with stability at room temperature. In this example, an ITO film having a thickness of 100 nm and being in the amorphous state is deposited by sputtering using a mixture gas of argon (Ar) gas and a gas containing hydrogen (H) such as hydrogen ($H_2$) gas or water vapor ($H_2O$).

Next, in a sixth photolithography process, a photoresist pattern is formed and the fourth conductive film (the amorphous ITO film) is selectively etched to be patterned, using the photoresist pattern as a mask. The fourth conductive film may be wet-etched with an oxalic-acid-based chemical solution containing, for example, 5 wt % oxalic acid and water. Then, the photoresist pattern is removed.

Consequently, as shown in FIGS. 1 and 2, the gate terminal pad 25 electrically connected with the gate terminal 4 through the gate contact hole 22, the source terminal pad 26 electrically connected with the source terminals 19a and 19b through the source contact hole 23, and the counter electrode 27 electrically connected with the common wire 5 through the common electrode contact hole 24 are formed by patterning the fourth conductive film. The slit opening 27a is provided in the counter electrode 27 through the above-mentioned patterning. Consequently, the TFT substrate shown in FIGS. 1 and 2 for use in the FFS LCD is completed.

During the assembly of the liquid crystal display panel, an alignment film and a spacer are formed on the surface of the completed TFT substrate. The alignment film is the film for aligning liquid crystals and is made of, for example, polyimide. The counter substrate including a color filter and an alignment film that have been individually produced is faced with and bonded to the TFT substrate according to this preferred embodiment. At this time, the TFT substrate and the counter substrate have a clearance formed by the spacer located therebetween. The liquid crystal layer is formed and sealed in the clearance. Consequently, the liquid crystal panel in the FFS mode is formed. Thus, the liquid crystal display including such liquid crystal display panel can drive liquid crystals through, from among the electric fields generated between the counter electrode 27 and the pixel electrode 20, the transverse electric field generated opposite to the pixel electrode 20 relative to the counter electrode 27.

Finally, polarizing plates, phase difference plates, and a backlight unit are mainly disposed on the outer side of the liquid crystal display panel, so that the liquid crystal display is completed.

<Summary of Preferred Embodiment>

The TFT substrate and the liquid crystal display according to this preferred embodiment described above has the following configuration. The first source electrode 12 and the first drain electrode 13 made of a conductor (such as a metal layer or an alloy layer) other than oxide conductors are located over the semiconductor channel layer 7 made of an oxide semiconductor with the protective insulating layers 9, 10, and 11 located therebetween. Such configuration can prevent or reduce the damage to the semiconductor channel layer 7 during the processing for forming the source electrode and the drain electrode. Thus, this configuration can enhance the characteristics and the reliability of the TFTs.

In this preferred embodiment, the second source electrode 16 and the second drain electrode 17 made of an oxide conductor provides connections between the semiconductor channel layer 7 and the first source electrode 12 and between the semiconductor channel layer 7 and the first drain electrode 13. The first source electrode 12 and the first drain electrode 13 are made of a conductor other than oxide conductors. Unlike the conventional technique, this configuration can prevent or reduce the oxidation-reduction reaction occurring between the semiconductor channel layer 7 and the first source electrode 12 and between the semiconductor channel layer 7 and the first drain electrode 13. Consequently, the contact properties in the relevant interfaces are improved, resulting in the improvement in the on-state current value and the value of mobility. This enhances the characteristics and the reliability of the TFTs.

If the semiconductor channel layer 7 extends off the periphery (the edge portion) of the gate electrode 2 in plan view, the breakdown voltage in the step portion formed in the periphery of the gate electrode 2 due to the thickness of the gate electrode 2 could be deteriorated or stepped cuts (wire breakage or ruptures associated with the step portion) could appear in the source electrode and the drain electrode formed above the step portion.

In this preferred embodiment, meanwhile, the semiconductor channel layer 7 is located inside the periphery of the gate electrode 2 in plan view. Thus, the first insulating film 6 and the protective insulating layers 10 and 11 are formed above the step portion of the gate electrode 2, thereby improving the breakdown voltage between the gate electrode 2 and the source electrode and between the gate electrode 2 and the drain electrode. The protective insulating layers 9, 10, and 11 are formed to cover the semiconductor channel layer 7, thereby preventing or reducing the electrical short circuit defects between the gate electrode 2 and the first source electrode 12. The coverage properties (the covering ability) of the source electrode and the drain electrode are enhanced, which prevents or reduces the stepped cut defects of the source electrode and the drain electrode associated with the step portion.

Under the method for manufacturing TFT substrate according to this preferred embodiment, the protective insulating layers 9, 10, and 11 and the electrode body 28 that is to be formed into the first source electrode 12 and the first drain electrode 13 are formed in one photolithography process. Then, the second source electrode 16, the second drain electrode 17, and the pixel electrode 20 as well as the first source electrode 12 and the first drain electrode 13 are formed in another photolithography process. Such manufacturing method eliminates the need for performing the photolithography dedicated to the formation of the protective insulating layers 9, 10, and 11 that protect the semiconductor channel layer 7. This controls the decrease in production capacity and the increase in the manufacturing cost associated with the increase in the number of masks for the photolithography.

As described above, in this preferred embodiment, the first source electrode 12 and the first drain electrode 13 made of a conductor other than oxide conductors are located over the semiconductor channel layer 7 made of an oxide semiconductor with the protective insulating layers 9, 10, and 11 located therebetween. This can prevent or reduce the damage to the semiconductor channel layer 7 resulting from the film deposition and etching during the formation of the first source electrode 12 and the first drain electrode 13, thus enhancing the characteristics and the reliability of the TFTs. The use of the oxide semiconductor film having a higher mobility as the semiconductor channel layer 7 of the TFT allows for the high-yield manufacturing of a TFT substrate having a higher operating speed and a liquid crystal display including the TFT substrate. Thus, high-performance TFT substrates and liquid crystal displays can be manufactured with high productivity.

<Modification>

Figure 13:
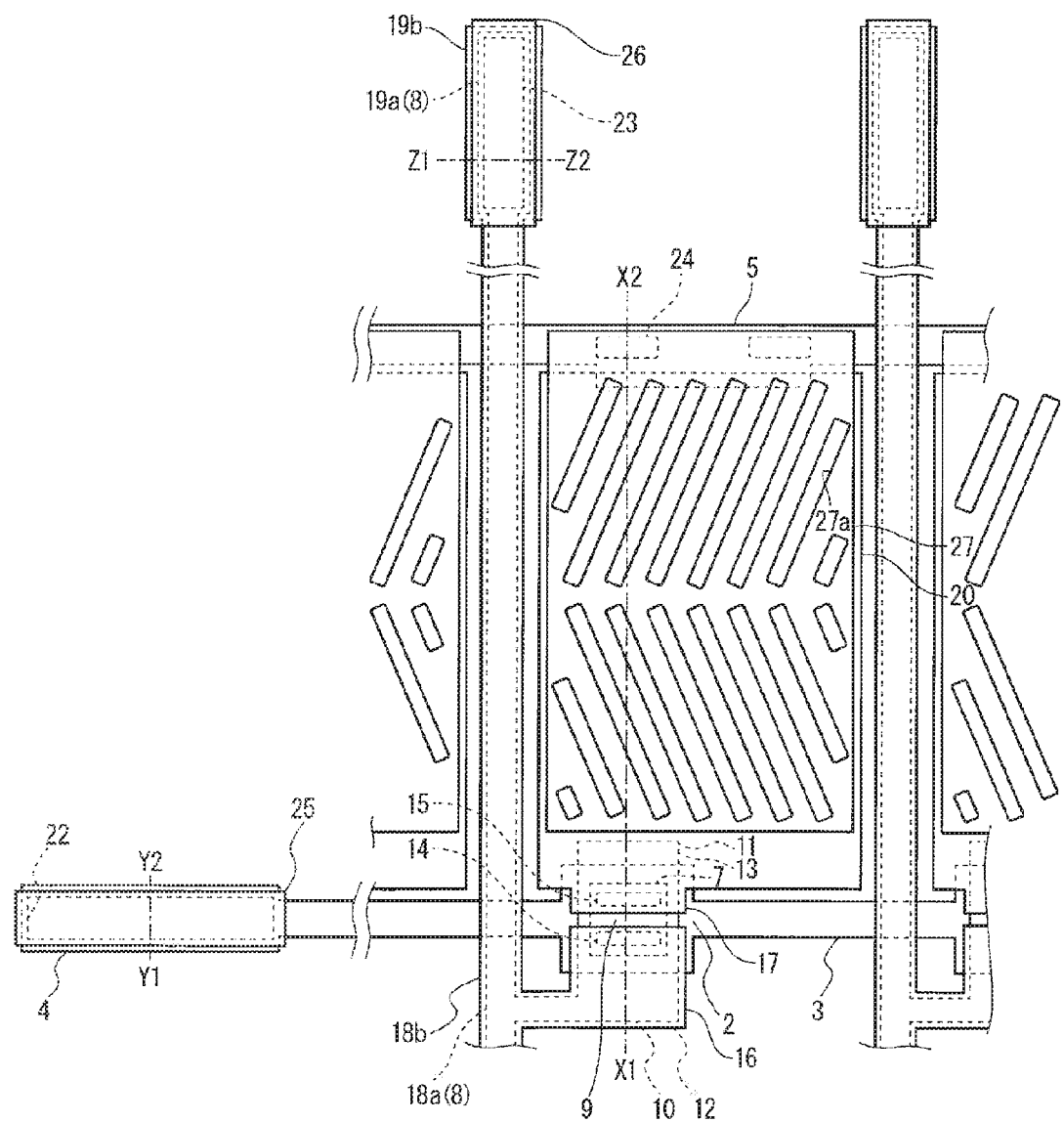
FIG. 13 is a plan view of the configuration of a TFT substrate according to a modification.
Figure 14:
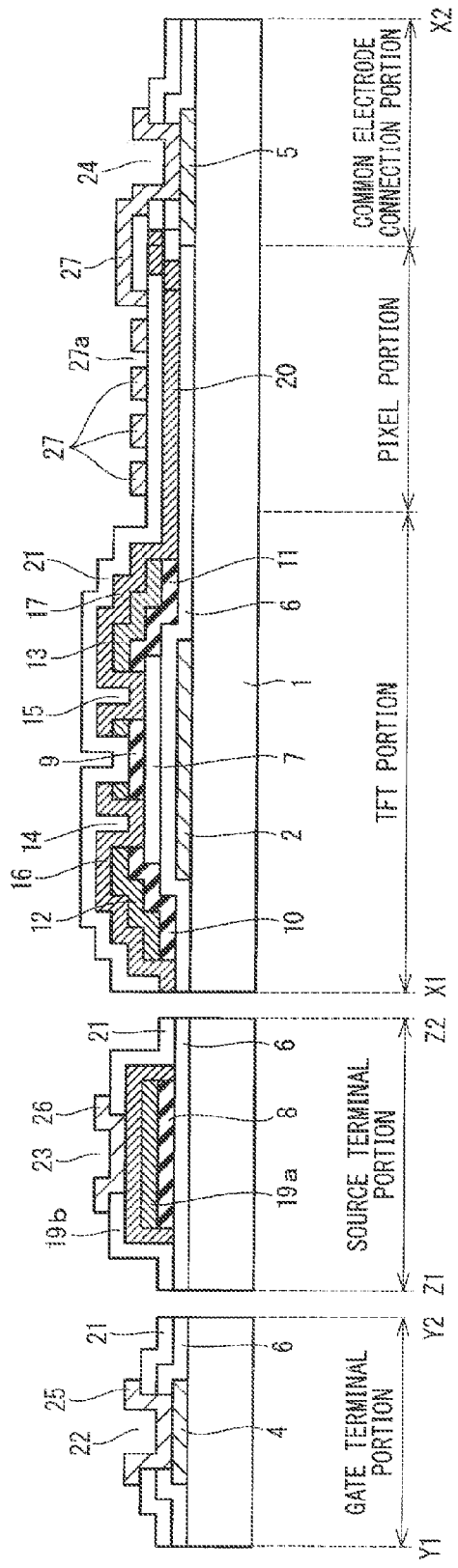
FIG. 14 is a cross-sectional view of the configuration of the TFT substrate according to the modification.

With reference to FIGS. 13 and 14, the following describes the configuration of a TFT substrate according to a modification of this preferred embodiment. FIG. 13 is a view of the planar configuration of the pixel portion as well as the gate terminal portion and the source terminal portion outside the pixel portion (the pixel display region) of the TFT substrate in the FFS mode according to this modification. FIG. 14 is a view of the cross-sectional configuration of these portions. FIG. 14 shows cross sections taken along the line X1-X2, the line Y1-Y2, and the line Z1-Z2 in FIG. 13. The cross section taken along the line X1-X2 corresponds to the region (the pixel portion) in which pixels are located. The cross section taken along the line Y1-Y2 corresponds to the region (the gate terminal portion) in which the gate terminal 4 and the gate terminal pad 25 for supplying a gate signal to the gate wire 3 (not shown in FIG. 14) are located. The cross section take along the line Z1-Z2 corresponds to the region (the source terminal portion) in which the source terminals 19a and 19b and the source terminal pad 26 for applying a display signal to the source wires 18a and 18b (not shown in FIG. 14) are located.

In this modification, at least one of the common wire 5 and the pixel electrode 20 in the first preferred embodiment has a pattern that is partially changed in such a manner that at least a part of the pixel electrode 20 overlaps at least a part of the common wire in plan view. The formation of such overlapping region adds the auxiliary capacitance to the liquid crystal capacitance of the pixel electrode 20, thereby improving the retention properties of retaining electric charges of an image signal written upon the pixel electrode 20. Consequently, the display defects such as uneven brightness can be prevented or reduced, thus providing the liquid crystal display panel (liquid crystal display) in the FFS mode having higher display quality.

In the first preferred embodiment and the modification mentioned above, the application of the present invention to the liquid crystal display panel (liquid crystal display) in the FFS mode has been described as an example. The structure associated with the TFT portion and the pixel electrode 20 connected with the TFT portion is applicable not only to the FFS LCDs but also to, for example, the transmissive LCDs in the twisted nematic (TN) mode that include pixel electrodes made of an oxide conductor.

The transmissive LCDs in the TN mode having the present invention applied thereto has the same configuration as that of the first preferred embodiment including the basic configuration of the TFT portion and the structure for connecting the TFT portion with the pixel electrode 20 except that the configuration of the common wire 5 and the counter electrode 27 located over the TFT substrate are omitted. In place of the counter electrode 27 located over the TFT substrate, a counter electrode made of an oxide conductor such as an ITO film is located across the entire pixel display region on the counter substrate including a color filter and an alignment film. This configuration is partially changed in such a manner that liquid crystals are driven by the electric field generated between the pixel electrode 20 located on the TFT substrate and the counter electrode located on the counter substrate.

Such configuration changed as described above also produces the basic effects as in the first preferred embodiment. Thus, this configuration can prevent or reduce the damage to the semiconductor channel layer 7 resulting from the film deposition and etching during the formation of the first source electrode 12 and the first drain electrode 13, thereby producing the effect of enhancing the characteristics and the reliability of the TFTs. As another effect of this configuration, the use of the oxide semiconductor film having a higher mobility as the semiconductor channel layer 7 of the TFT allows for the high-yield manufacturing of a TFT substrate having a higher operating speed and a liquid crystal display including the TFT substrate. Thus, as in the first preferred embodiment, high-performance TFT substrates and liquid crystal displays can be manufactured with high productivity.

In the present invention, the above preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a thin film transistor substrate, comprising:
    preparing an insulating substrate including a gate electrode and an oxide semiconductor film formed thereon, said oxide semiconductor film being formed over said gate electrode with a first insulating film formed therebetween;
    forming an insulating layer on said oxide semiconductor film so as to cover said oxide semiconductor film;
    forming a conductive film that covers said oxide semiconductor film with said insulating layer located therebetween;
    forming a second insulating film on said oxide semiconductor film and an electrode body on said second insulating film by patterning said insulating layer and said conductive film in one photolithography process such that at least a part of said insulating layer and a part of said conductive film are left on said oxide semiconductor film; and
    forming, after said electrode body is formed, a first source electrode and a first drain electrode by dividing said electrode body, said first source electrode and said first drain electrode being separated from each other on said second insulating film.

2. The method for manufacturing a thin film transistor substrate according to claim 1, wherein said first source electrode and said first drain electrode are formed by dividing said electrode body through patterning and a second source electrode, a second drain electrode, and a pixel electrode are formed through patterning in another photolithography process.

3. The method for manufacturing a thin film transistor substrate according to claim 1, wherein, when said electrode body is formed, a contact hole for exposing a part of said oxide semiconductor film is formed in said insulating layer and said electrode body through etching,
    said method further comprising forming a second drain electrode that extends on said first drain electrode, said contact hole, and said oxide semiconductor film and is formed of an oxide conductor.

4. The method for manufacturing a thin film transistor substrate according to claim 1, wherein said electrode body is formed of a conductive film integrally formed across a source electrode formation region in which said first source electrode is formed and a drain electrode formation region in which said first drain electrode is formed.

5. The method for manufacturing a thin film transistor substrate according to claim 3, further comprising forming a pixel electrode formed of an oxide conductor, said pixel electrode extending from said second drain electrode.

6. The method for manufacturing a thin film transistor substrate according to claim 1, wherein each of said first source electrode and said first drain electrode is formed of a conductor other than oxide conductors.

7. The method for manufacturing a thin film transistor substrate according to claim 5, further comprising forming a third insulating film on said pixel electrode and forming a counter electrode on said third insulating film.

* * * * *